United States Patent [19]

Snider

[11] Patent Number: 5,519,629
[45] Date of Patent: May 21, 1996

[54] TILEABLE GATE ARRAY CELL FOR PROGRAMMABLE LOGIC DEVICES AND GATE ARRAY HAVING TILED GATE ARRAY CELLS

[75] Inventor: Gregory S. Snider, Mountain View, Calif.

[73] Assignee: Hewlett-Packard Company, Palo Alto, Calif.

[21] Appl. No.: 432,234

[22] Filed: May 1, 1995

Related U.S. Application Data

[63] Continuation of Ser. No. 94,294, Jul. 19, 1993, abandoned.
[51] Int. Cl.$^6$ .................................................. G06F 17/50
[52] U.S. Cl. .......................... 364/490; 364/488; 364/489; 326/38
[58] Field of Search .................................. 364/488–491; 340/825.83, 825.86, 825.89; 326/38, 39, 41, 47

[56] References Cited

U.S. PATENT DOCUMENTS

| | | | |
|---|---|---|---|
| Re. 34,363 | 8/1993 | Freeman | 307/465 |
| Re. 34,444 | 11/1993 | Kaplinsky | 340/825.8 |
| 4,642,487 | 2/1987 | Carter | 307/465 |
| 4,706,216 | 11/1987 | Carter | 365/94 |
| 4,758,985 | 7/1988 | Carter | 365/94 |
| 4,775,942 | 10/1988 | Ferreri et al. | 364/491 |
| 4,922,441 | 5/1990 | Tsukagoshi et al. | 364/491 |
| 5,036,473 | 7/1991 | Butts et al. | 364/489 |
| 5,109,353 | 4/1992 | Sample et al. | 364/578 |
| 5,122,685 | 6/1992 | Chan et al. | 307/465.1 |
| 5,140,193 | 8/1992 | Freeman et al. | 307/465 |
| 5,208,491 | 5/1993 | Ebeling et al. | 307/465 |
| 5,255,203 | 10/1993 | Agrawal et al. | 364/489 |
| 5,260,881 | 11/1993 | Agrawal et al. | 364/489 |
| 5,313,119 | 5/1994 | Cooke et al. | 307/465.1 |
| 5,323,069 | 6/1994 | Smith, Jr. | 307/465.1 |
| 5,329,460 | 7/1994 | Agrawal et al. | 364/489 |

FOREIGN PATENT DOCUMENTS

| | | | |
|---|---|---|---|
| 0461798A2 | 12/1991 | European Pat. Off. | H03K 19/177 |
| 0507507A2 | 10/1992 | European Pat. Off. | H03K 19/177 |

OTHER PUBLICATIONS

P. K. Chan, M. D. F. Schlag, "Architectural Tradeoffs in Field–Programmable–Device–Based Computing Systems", 1993 IEEE, pp. 152–161.
J. F. McDonald et al., "Wafer Scale Integration (WSI) of Programmable Gate Arrays (PGA's)", 1990 IEEE, pp. 329–337.
T. Kean et al. "Implementation of Configurable Hardware Using Wafer Scale Integration" 1990 IEEE, pp. 68–73.
J. P. Gray, T. A. Kean "Configurable Hardware: A New Paradigm for Computation" 1989 Decennial Caltech Conference, pp. 1–17.
T. Kean, J. Gray "Configurable Hardware: Two Case Studies of Micro–Grain Computation" 1989 International Conference on Systolic Arrays, pp. 1–10.
P. Bertin et al. "Introduction to Programmable Active Memories", 1989 Digital PRL, pp. 1–9.
S. Monaghan, P. D. Noakes "Reconfigurable special purpose hardware for scientific computation and simulation", 1992 Computing & Control Engineering Journal, pp. 225–234.
N. Howard, R. W. Taylor "Reconfigurable logic: technology and applications", 1992 Computing & Control Engineering Journal, pp. 235–240.
D. D. Hill, D. R. Cassiday "Preliminary Description of Tabula Rasa, an Electrically Reconfigurable Hardware Engine" 1990 IEEE, pp. 391–395.

(List continued on next page.)

*Primary Examiner*—Kevin J. Teska
*Assistant Examiner*—Leigh Marie Garbowski

[57] ABSTRACT

A logic and routing cell for constructing a programmable gate array. The gate array may be constructed by tiling a wafer surface with this single logic and routing cell design. The logic and routing cell includes both the logic cell and the routing circuitry needed to connect that logic cell to all levels of a hierarchical routing system for making connections between the various logic cells.

4 Claims, 7 Drawing Sheets

LEVEL 0
BUS
CONNECTIONS

LEVEL 2
BUS
CONNECTIONS

LEVEL 1
BUS
CONNECTIONS

LEVEL 3
BUS
CONNECTIONS

OTHER PUBLICATIONS

D. W. Van den Bout et al. "AnyBoard: An FPGA–Based, Reconfigurable System" 1992 IEEE, pp. 21–30.

J. Vitanen, T. Kean "Image Pattern Recognition Using Configurable Logic Cell Arrays", 1989 CG International 7th Annual Conference of the Computer Graphics Society (CGS), pp. 355–368.

T. Kean et al. "A Novel Implementation Style for Teaching VLSI" 1989 VLSI Education Conference and Exposition.

Yee, Jenny, "Programmierbare Logik mit Flexibler Ausgangsarchitektur", Elektronik Industrie 9, 1985, pp. 43–48.

LEVEL 0 BUS CONNECTIONS

LEVEL 2 BUS CONNECTIONS

LEVEL 1 BUS CONNECTIONS

LEVEL 3 BUS CONNECTIONS

TILEABLE GATE ARRAY CELL FOR PROGRAMMABLE LOGIC DEVICES AND GATE ARRAY HAVING TILED GATE ARRAY CELLS

CROSS REFERENCE TO RELATED APPLICATION

This is a continuation of copending application Ser. No. 08/094,294 filed on Jul. 19, 1983, now abandoned.

FIELD OF THE INVENTION

The present invention relates to integrated circuits, and more particularly, to an improved architecture for programmable logic arrays.

BACKGROUND OF THE INVENTION

For the purposes of this discussion, programmable logic is defined to be digital circuitry of fixed connectivity that can be configured by a user to emulate other digital systems of arbitrary topologies at high speed. It can be used to create high speed logic simulators as well as configurable compute engines capable of outperforming supercomputers at certain tasks for a fraction of the cost. Programmable logic systems capable of emulating large digital circuits (with hundreds of thousands of gates) are expensive, typically costing on the order of one to two dollars per emulated gate, and require a large number of integrated circuits distributed across multiple, complex printed circuit boards.

One class of programmable logic is based on Field Programmable Gate Array (FPGA) technology. The basic idea behind this approach is to connect a number of FPGAs together in a fixed topology. Each FPGA includes two types of resources: (1) a number of logic cells which can be programmed or configured to perform a specific logic function (such as "AND" or "EXCLUSIVE OR"); and (2) routing resources which can be programmed to interconnect the logic cells with each other and with external input/output pins. The programmed FPGA thus forms a useful logic circuit which is a subset of the entire logic system to be simulated; the entire set of FPGAs taken together then functionally simulates the desired logic system. Since the FPGAs in these architectures have fixed physical connections among them that cannot be altered, simulating a logic system requires a mapping of the circuit for the logic system of interest onto the interconnected FPGAs such that the logic functions and interconnections of the original circuit are precisely represented by the programming of the FPGAs. High speed simulation is possible since the logic cells within the FPGAs perform their computations in parallel, communicating their results with each other through the routing network.

Designing programmable logic capable of high capacity (greater than 1,000,000 gates) and speed (a clock rate greater than 1 MHz) presents several, often conflicting, challenges. First, mapping or "compiling" an arbitrary logic system onto the fixed topology is a difficult and potentially computationally expensive procedure. This problem is substantially reduced if the architecture allows the mapping problem to be broken into a set of simpler, loosely coupled subproblems.

Second, because a generic, programmable structure is being used for emulating a wide variety of possible user designs or algorithms, there is considerably more routing and logic "overhead" than there would be in an optimized layout of the user's design. This overhead must be contained within reasonable bounds while still providing a compilable target.

Third, the design of the architecture and its implementation are necessarily coupled when optimizing data paths for delay.

Finally, the topology and physical organization of the architecture directly affects the difficulty of its implementation. Regular structures with simple interconnections are easier to build.

These problems are best addressed by logic structures that utilize a hierarchical structure for the routing structure network. The routing structure consists of a tree of routing circuits. The root node of the tree provides the input and output lines for the FPGA. The leaf nodes of the tree are connected to the logic cells.

It would be advantageous to provide such a structure on a single wafer to minimize the number of external connections. Prior art architectures of programmable logic systems have been found lacking in their adaptability to wafer scale integration. In prior art systems, the routing function has been implemented in separate router chips. That is, the system was constructed from two classes of basic chips, routers and logic chips. This approach has two main drawbacks when applied to designs requiring wafer-scale implementation. First, if the topology of the system is changed, the wafer must be completely redesigned. For example, if one were to design a system with a different number of levels in the tree routing structure, the size and shape of all of the routing cells would need to be changed. The new cells would then have to be fitted onto the wafer.

Second, this type of design has difficulty accommodating component failures. One important aspect of wafer scale integration is the need to accommodate component fabrication errors. Typically, additional components are provided and some means of substituting the additional components for the failed components is provided. Alternatively, the system should be able to function adequately without one or more of the components, provided the locations of the non-operative components is known.

Broadly, it is the object of the present invention to provide an improved FPGA system.

It is a further object of the present invention to provide an FPGA system that is more easily adapted to wafer scale integration than prior art FPGA systems.

It is a still further object of the present invention to an FPGA that can be constructed from a single sub-unit.

These and other objects of the present invention will become apparent to those skilled in the art from the following detailed description of the invention and the accompanying drawings.

SUMMARY OF THE INVENTION

The present invention comprises a logic and routing cell that is particularity well adapted for use in building FPGAs. The logic and routing cell includes a logic cell having a logic cell bus that includes p signal lines, where p>1. The logic cell performs operations on signals received on at least one of the signal lines and generates signals indicative of the results of the operations on at least one of the signal lines. The logic and routing cell also includes a plurality of signal buses, each signal bus including a plurality of signal lines. The signal buses are sequentially numbered from 0 to some predetermined number. The logic and routing cell also include a plurality of programmable switches, each switch providing connections between a signal line in one of the buses and a signal line in another of the buses. The switches are arranged such that at least one of the signal lines in signal bus k may be connected to at least one of the signal lines in signal bus (k−1), for k=1, 2, . . . , and each of the p signal lines in the logic cell bus may be connected to a signal line in bus 0.

A plurality of these logic and routing cells may be connected together to form an FPGA. The signal lines of the odd numbered buses are arranged in a parallel horizontal array and the signal lines of the even numbered buses are arranged in a parallel vertical array. Each signal line in a logic and routing cell is connected to a corresponding signal line in an adjacent logic and routing cell, provided an adjacent cell is present and provided a break is not present in the signal line. Breaks are present in the signal lines at predetermined locations in said two-dimensional array, the locations depending on the bus number in which said signal line is contained.

DETAILED DESCRIPTION OF THE INVENTION

The present invention is an architecture for programmable logic that is well matched to the strengths and weaknesses of wafer-scale integration, offering the potential for programmable logic systems of much lower cost and higher performance than has been achieved to date. The architecture is built from a single cell that includes both the routing structure for a multi-level routing network and a logic cell. The cells may then be combined in a manner that tiles the surface of a wafer.

Figure 1:
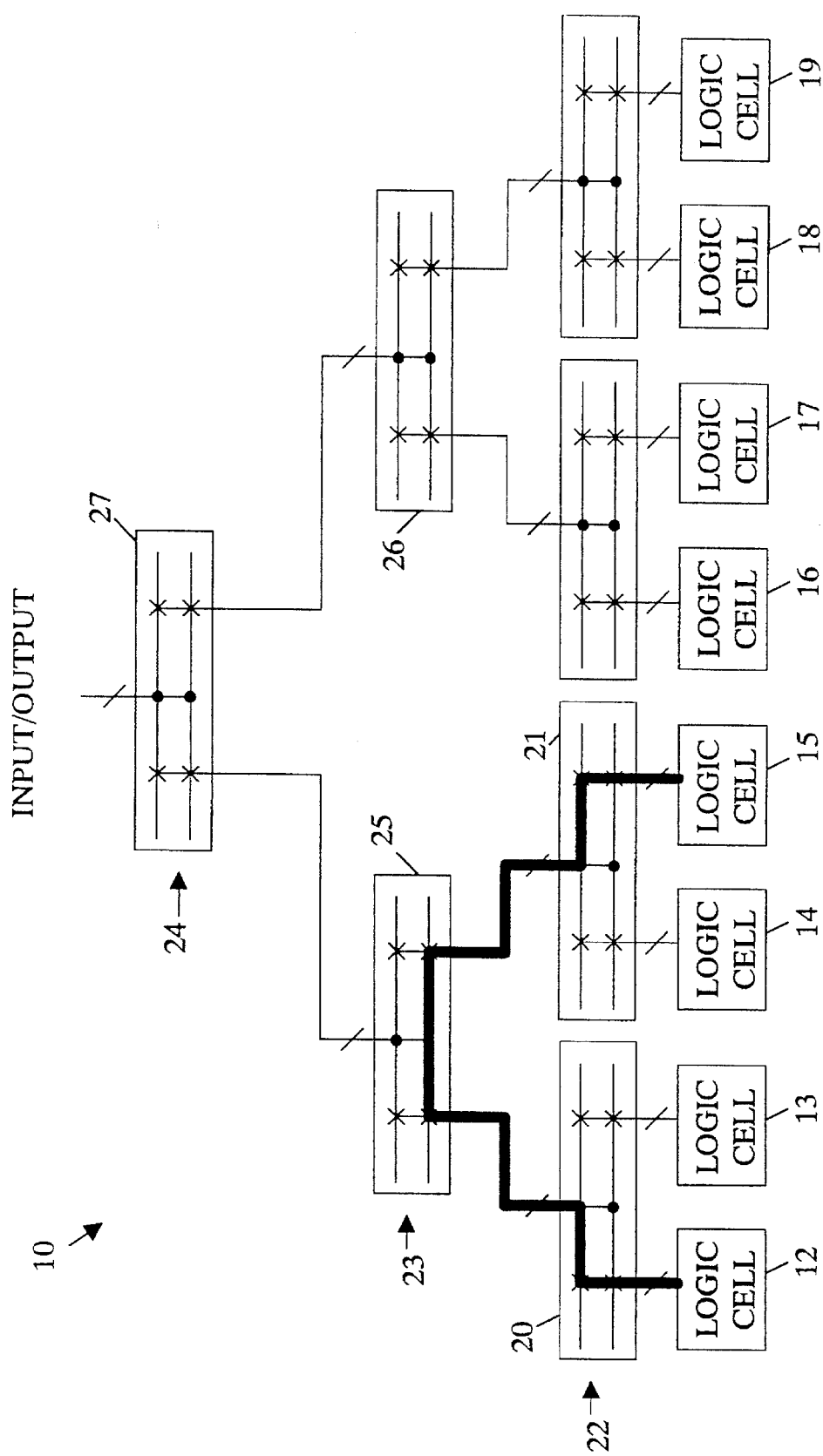
FIG. 1 is a block diagram of a hierarchical FPGA.

The present invention may be more easily understood with reference to a simple FPGA using a hierarchical routing design as shown in FIG. 1 at 10. FPGA 10 consists of a plurality of logic cells 12–19 connected by three levels of routers shown at 22–24. The first level of routers consists of the 4 routers that connect to the logic cells. The second level of routers consists of routers 25 and 26 which connect to the first level of routers. The final level of routers shown at 24 consists of router 27 which connects to the second level of routers and also provides input/output line connections. Each of the routers comprises a plurality of switch points for making cross-connects between the buses leaving the router and the buses entering the router. Switch points are indicted by junctions having X's. These cross-connect switches are used to make the various connections between the logic cells and the input and output lines. A path connecting logic cells 12 and 15 is shown in bold in FIG. 1.

Figure 2:
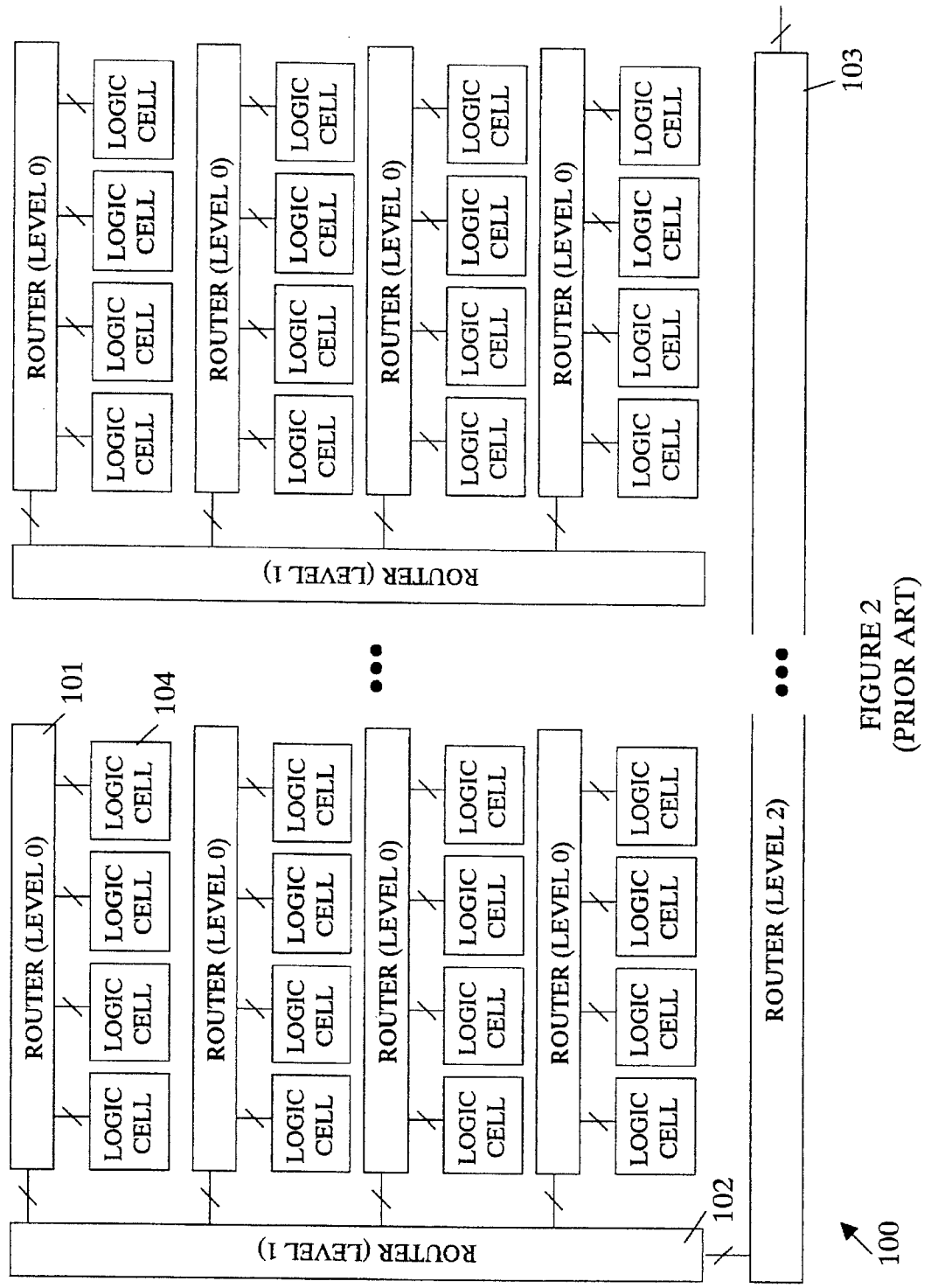
FIG. 2 is a block diagram of a prior art layout of a hierarchical FPGA.

The manner in which an FPGA of this type was laid out in prior art systems is shown in FIG. 2 at 100. FPGA 100 includes 3 levels of routers having a fan-out of four. Each level of routers connects to 4 routers (or logic cells) in the level below it. The levels of routers may be viewed as a set of nested cells that cover the surface of the integrated circuit. The smallest network consists of the logic cells and the level 0 routers. For example, router 101 is connected to four logic cells of which logic cell 104 is typical. Four such combinations are then connected to router 102. Four combinations terminating on a level 1 router are then connected to router 103 and so on.

While this type of structure fills the surface of a wafer, and hence, makes efficient use of the surface, it has several disadvantages. First, there are a large number of different structures needed to construct FPGA 100. Each level of router uses routers of a different shape from those used in the other levels. Hence, a system with a fan-out of four having 64,000 logic cells would require 8 levels of routers in addition to the logic cells. Hence, 9 basic structures are needed to construct such a system. If, for example, the logic cell or switch design used in the routers changes, all of the router structures must be re-designed to accommodate the new spacing on the wafer. Hence, the costs of changing a large FPGA design can be prohibitive.

Second, wafer scale integration requires a means for accommodating defective switch points and/or logic cells. If a logic cell fails, the system that compiles the applications for running on the FPGA can avoid the logic cell. A failed switch point, however, can cause the loss of many logic cells if the router in which it is located is disabled. Prior art FPGA systems do not provide for such failures in a manner that prevents the router and its associated sub-tree from being lost.

Figure 3:
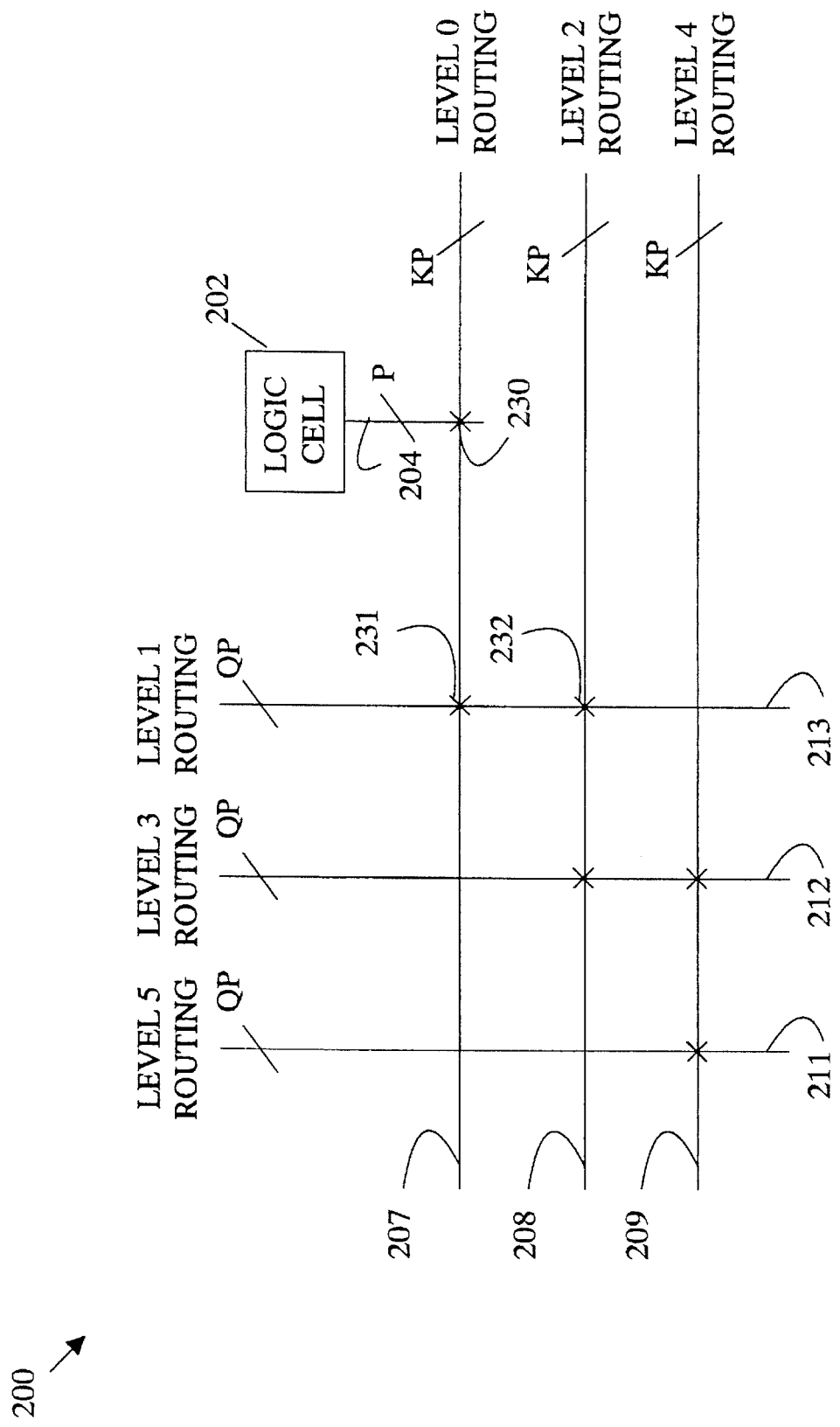
FIGS. 3 is a block diagram of a logic and routing cell according to the present invention.

An FPGA according to the present invention is constructed from a single logic and routing cell which combines both the routing functions of a multilevel hierarchical system such as the fractal tiling shown in FIG. 2 with the logic cell. A logic and routing cell 200 according to the present invention is shown schematically in FIG. 3. The logic cell is assumed to have P pins which are connected via bus 204 to a level 0 routing bus 207. Switch points 230 are used for making specific connections between the lines of bus 204 and those of bus 207. The number of lines in bus 207 will be K times P. The manner in which K is determined will be discussed in more detail below. For the purposes of the present discussion, it is sufficient to note that the cross-points allow each of the P lines in bus 204 to be connected to one or more of a corresponding set of K lines in bus 207. Connections between the level 0 routing functions and the level 1 routing functions are provided by cross-points 231. Cross-points 231 connect the QP lines of bus 213 to the KP lines of bus 207. The manner in which Q is determined will also be discussed in detail below.

In general, there is one bus for each level of routing. The even levels correspond to the horizontal buses 207–209. The odd levels correspond to the vertical buses 211–213. The number of lines in the even level buses are all the same in the preferred embodiment of the present invention. Similarly, the number of lines in the odd level buses are also the same in the preferred embodiment of the present invention. However, embodiments which do not follow this rule will still function. There is one set of switch points between connecting each level of buses; hence, the kth bus will have a set of switch points that connect it to the (k−1)st bus and another set of switch points that connect it to the (k+1)st bus.

The optimum number of horizontal and vertical routing lines needed for each router is a function of the fan-out of the routing stages in the hierarchy and the number of logic modules in the FPGA. The number can be estimated using Rent's Rule. Rent's Rule states that a logic circuit consisting of n components, e.g., logic gates, with an average of p signal pins per component requires $pn^{\alpha}$ input and output signals, where $\alpha$ is some number between 0.5 and 0.75.

An important application of Rent's Rule is the rough prediction of the results on min-cut partitioning of a logic system. Min-cut partitioning refers to the process of partitioning a circuit into N roughly equal partitions such that the number of signals that must cross from one partition to another is minimal. For example, consider a circuit of g gates with an average of p pins per gate that is divided into two partitions using min-cut partitioning. After the partitioning, each half circuit will consist of approximately g/2 gates. The number of signal lines that are cut by the partitioning would be expected to be $p(g/2)^{\alpha}$. By recursively applying the min-cut portioning procedure to a circuit until there is a small number of cells in each partition, a hierarchical structure may be extracted. Each level of the hierarchy represents one level of partitioning.

A routing subnetwork can be implemented as a horizontal array of routers. Each router connects with $\beta$ signal lines to the level above it and with N sets of $\gamma$ signal lines to the level below it. In the case in which N=4 and $\alpha$=0.5, it can be shown that $\beta=2\gamma$. It can also be shown that for an FPGA having t logic cells, the optimum number of horizontal lines per cell is approximately $(3p/4)\log_2(t)$, and the optimum number of vertical lines per cell is approximately $(3p/8)\log_2(t)$.

The switch points connecting the horizontal and vertical lines need not be fully populated. Each horizontal or vertical line corresponds to a horizontal line in a router in the topologically equivalent network, such as shown in FIG. 1. The horizontal router lines in the hierarchical network all have the same fixed number of switches on them. Hence, it is sufficient for each line in the final network obtained by connecting the logic and routing cells together to have the same number of switches. As will be discussed in more detail below, higher level routine lines are longer in the final gate array; hence, the number of switches per unit length, i.e., per logic and routing cell, can be lower than for lower level routing lines. Assume that the level 0/level 1 switch points are fully populated,, i.e., there is one switch at each intersection of a horizontal and vertical routing line, then the level 2/level 3 switch points and the level 3/level 4 switch points need only be ¼ populated. Similarly, the level 4/level 5 switch points will only need to be ¹⁄₁₆ populated.

It should be noted that the above estimate for the optimal number of signal lines and switch points assumes that there are no defects in either the signal lines or the switch points. Additional signal lines and switch points may be included to provide spares in the event that subsequent testing of a logic cell indicates that it has a defect.

Figure 4:
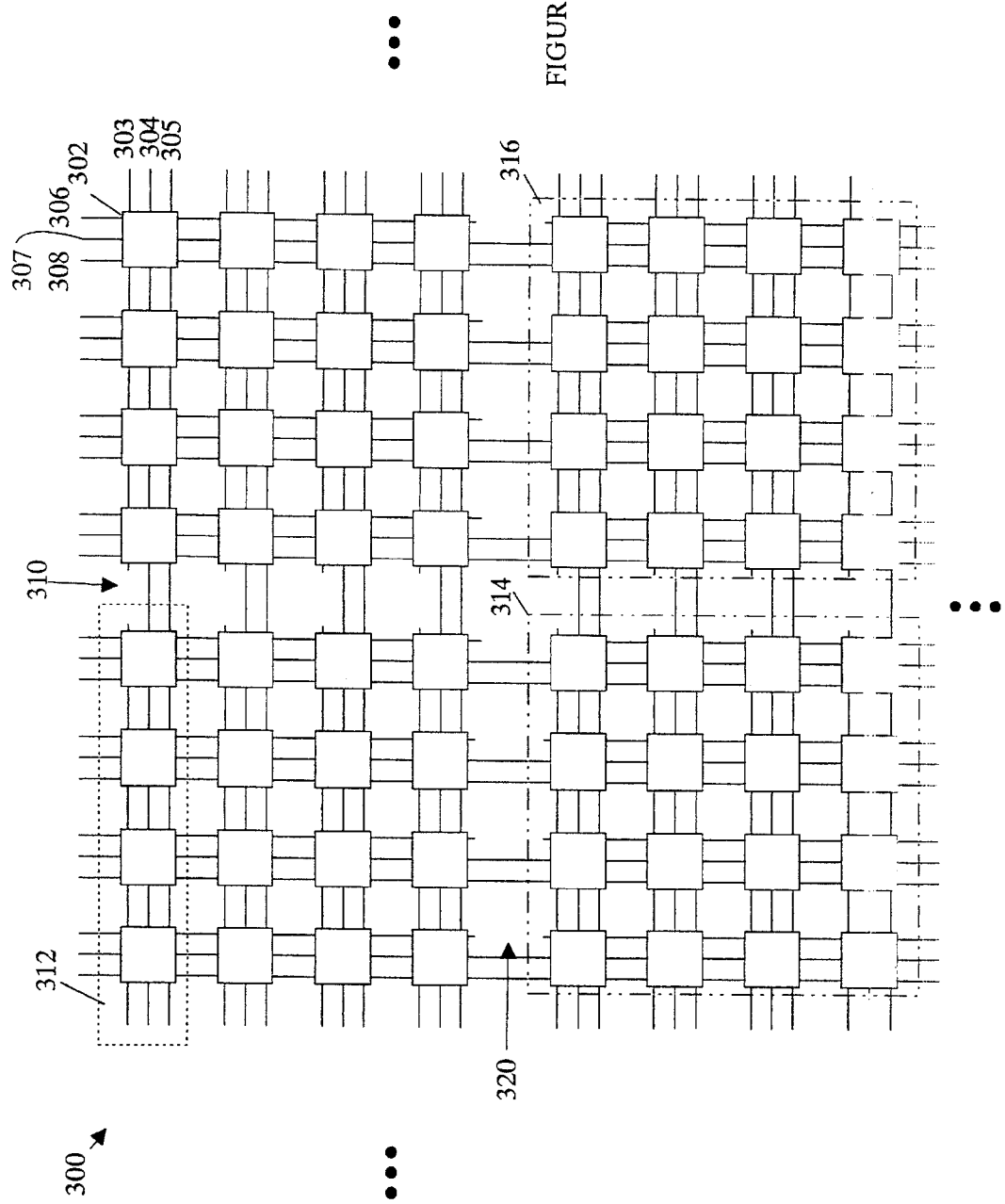
FIG. 4 is a block diagram of a portion of an FPGA constructed from logic and routing cells according to the present invention.
Figure 5:
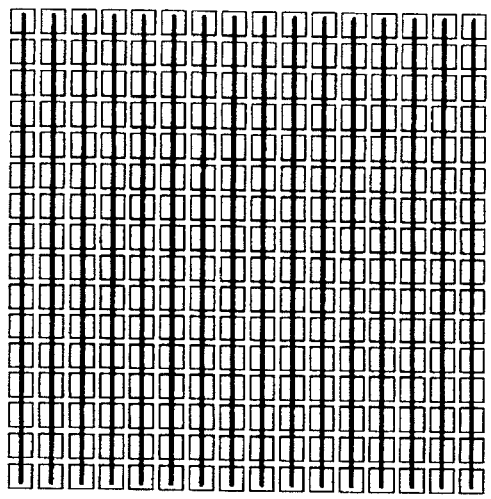
FIGS. 5–8 illustrate the bus connections at various levels in an exemplary FPGA according to the present invention.
Figure 7:
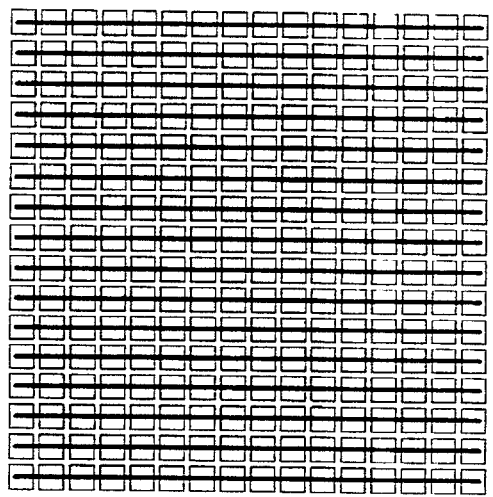
Figure 6:
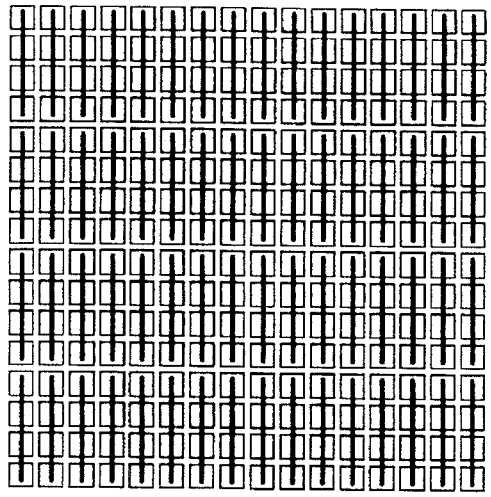
Figure 8:
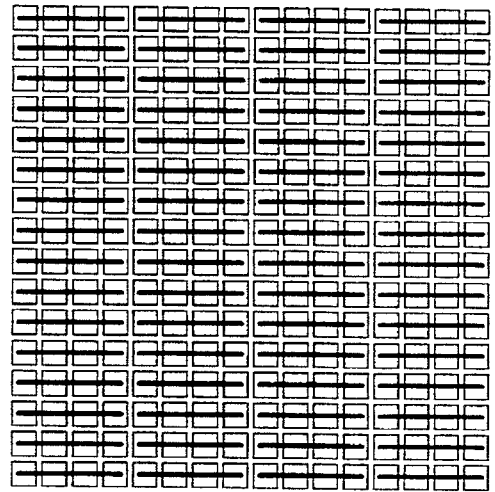

The manner in which the logic and routing cells according to the present invention are connected to form a FPGA will now be explained in more detail for the case in which N=4. FIG. 4 illustrates a portion of a FPGA 300 constructed from logic and routing cells according to the present invention. A typical logic and routing cell is shown at 302. The level 0, 2, and 4 routing buses are shown at 303–305, respectively. Similarly, the level 1, 3, and 5 routing buses are shown at 306–308. The lowest level of the hierarchy, referred to as level 0, is constructed by connecting groups of 4 logic and routing cells horizontally. A typical group is shown at 312. Within this group, the routing buses 303–305 of each cell are connected to the corresponding routing buses of the adjacent logic and routing cell. At the boundary of the group, a break is introduced into the level 0 routing bus as shown at 310.

Similarly, the first level of the hierarchy is constructed by grouping 4 horizontal level 0 groups together to form a 4×4 grouping of logic and routing cells. Such groupings are shown at 314 and 316. Within each of these 4×4 groupings, all of the vertical buses 306–308 of a given logic and routing cell are connected to the corresponding vertical buses in the adjacent logic and routing cells. At the boundary of the group, a break is introduced in each of the level 1 buses as shown at 320.

The second level of the hierarchy is constructed by combining 4 of the 4×4 groupings in the horizontal direction. Within the second level grouping, the level 2, 3, 4, . . . routing buses of each cell are connected to the corresponding buses in the adjacent cells. At the boundary of each second level grouping, a break is introduced in the level 2 routing bus of each cell on the edge.

The third level of the hierarchy is constructed by combining 4 of the level 2 groupings in the vertical direction. Within the third level grouping, the level 3, 4, . . . routing buses of each cell are connected to the corresponding buses in the adjacent cells. At the boundary of each third level grouping, a break is introduced in the level 3 routing bus of each cell on the edge. A simplified view of the level 0–3 bus connections for the entire 16×16 array of logic and routing cells is shown in FIGS. 5–8. This process is continued for as many levels as desired in the particular FPGA.

Figure 9:
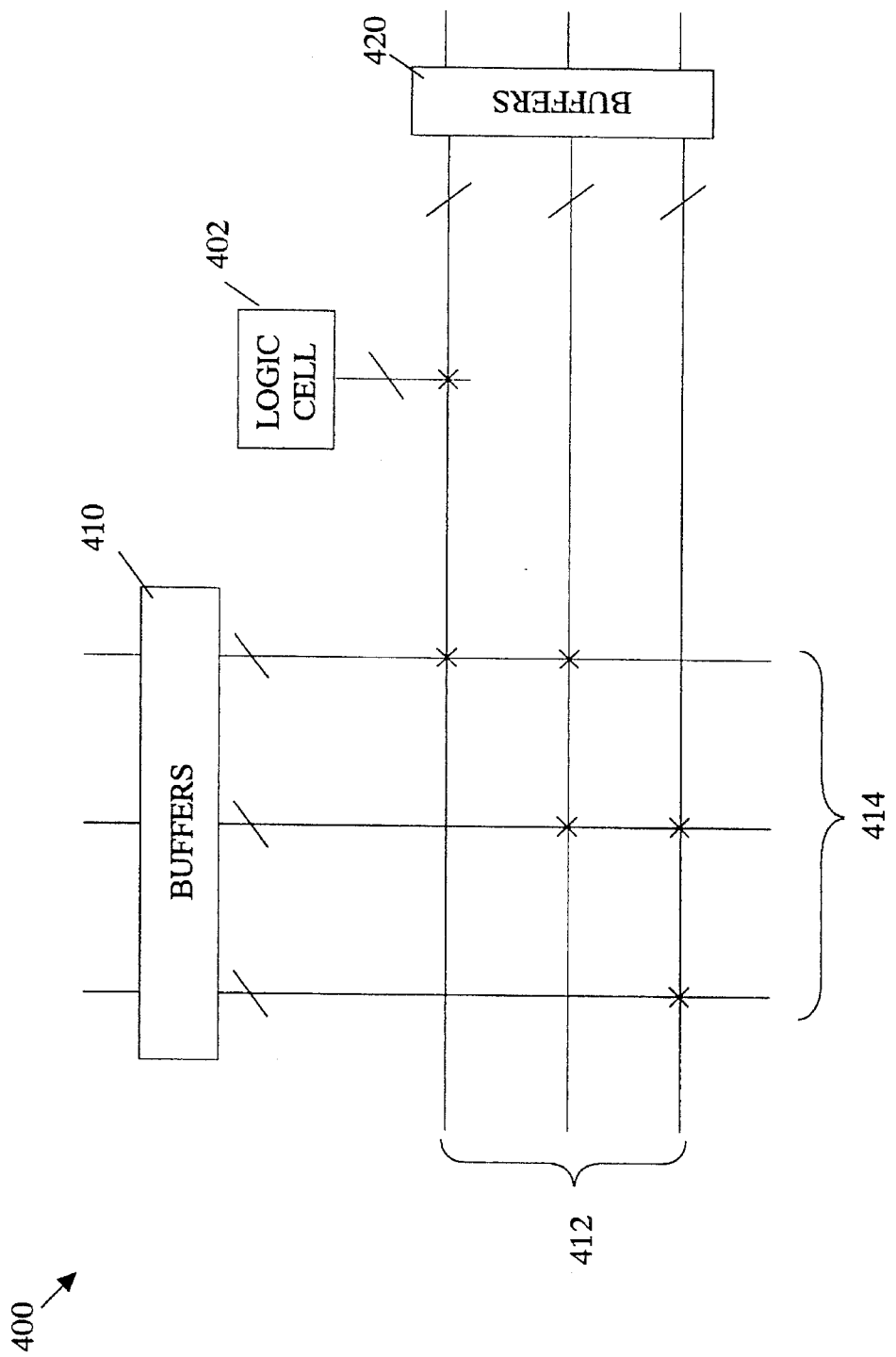
FIG. 9 is a block diagram of another embodiment of a logic and routing cell according to the present invention.

The manner in which the horizontal and vertical buses are connected in the preferred embodiment of the present invention may be more easily understood with reference to FIG. 9 which illustrates a logic and routing cell 400 having a logic cell 402. The horizontal buses 412 are routed to the next horizontal cell via a set of programmable, bi-directional buffers 420 at the interface with the adjacent cell on one side. Similarly, the vertical bus lines 414 are routed to the adjacent vertical cell via a set of programmable, bi-directional buffers 410 at the interface with the adjacent cell above the cell in question. Each buffer can be programmed to isolate the lines on each of its sides. Hence, the routing line lengths can be determined simply by appropriate configuration of the buffers.

It will be apparent to those skilled in the art that the breaks in the buffer lines could also be introduced by merely breaking the lines at the appropriate points. This approach has the advantage of not requiring buffers on every line of every logic and routing cell. This approach, however, results in a cell structure in which every logic and routing cell is not quite identical to every other logic and routing cell. It will also be apparent to those skilled in the art that a combination of these two approaches may be used.

The architecture described above is well matched to wafer scale integration. An FPGA chip can itself be tiled across a wafer. The individual chips are aligned on the wafer such that the horizontal and vertical routing lines of adjacent chips are connected. In the preferred embodiment of the present invention, each chip contains configuration and control circuitry for the logic and routing cells within its domain.

While the above embodiments of the present invention have been described in terms of the same fan-out at each level of the hierarchy, it will be apparent to those skill in the art that mixed fan-out systems in which all routers at a given level have the same fan-out are possible. In such a system, the fan-out at different levels in the hierarchy may be different. The preferred fan-out is in the range of 4 to 16.

Figure 10:
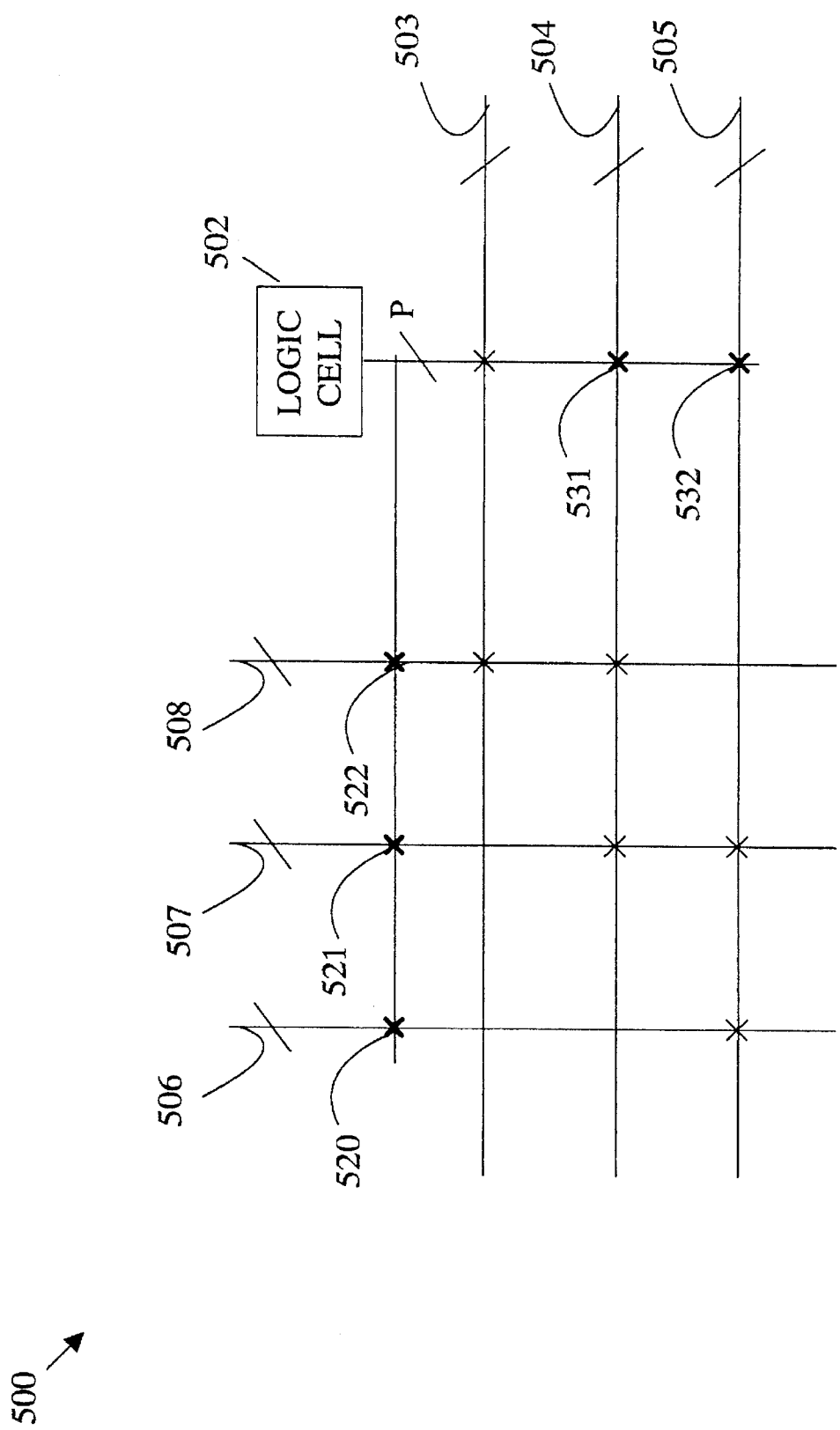
FIG. 10 is a block diagram of another embodiment of a logic and routing cell according to the present invention.

While the above-described embodiments of the present invention represent a substantial improvement over the prior art, additional crossbar switches can be added, space permitting, to the logic and routing cells to improve system performance. A logic and routing cell 500 utilizing these additional switch points is shown in FIG. 10. Logic and routing cell 500 differs from the above-described logic and routing cells in that the logic cell 502 is also connected directly to all levels of the routing hierarchy. This is accomplished by introducing switch points connecting the p signal lines from logic cell 502 to the signal lines of each of the routing buses above the level 0 routing bus. The switch points corresponding to buses 504 and 505 are shown at 531 and 532, respectively. Those corresponding to the odd numbered levels 506–508 are shown at 520–522, respectively. No additional switch points are needed for the level 0 routing bus 503 because this bus is already connected to the signal lines from routing cell 502.

Connecting a logic cell to all layers of routing that go past the logic cell allows for shortcuts in routing. For example, in the absence of these additional switch points, a signal connecting two widely separated logic cells may have to traverse from its source up the hierarchy and then back down the hierarchy to its destination. The additional connections allow this to be short-circuited by directly jumping from the signal source to the highest level of routing needed to make the connection to the destination. Similarly, at the destination, the signal can be routed directly from a higher level than 0. This type of routing reduces overhead and propagation delays.

Various modifications to the present invention will become apparent to those skilled in the art from the foregoing description and accompanying drawings. Accordingly, the present invention is to be limited solely by the scope of the following claims.

What is claimed is:

1. A gate array cell comprising:

a logic cell having a logic cell bus including p logic cell signal lines, said logic cell performing operations on signals received on at least one of said logic cell signal lines and generating signals indicative of the results of said operations on at least one of said logic signal lines;

a plurality of signal buses, each said signal bus including a plurality of signal bus signal lines, said signal buses being sequentially numbered from 0 to some predetermined number which is greater than one; and a plurality of programmable switch means, each said switch means providing means for connecting a signal bus signal line in one of said signal buses to a signal bus signal line in another of said signal buses, said plurality of switch means being arranged such that at least one of said signal bus signal lines in signal bus k is adapted to be connected to at least one of said signal bus signal lines in signal bus (k−1) for k=1 to said predetermined number, and each of said p logic cell signal lines in said logic cell bus being corrected by a different one of said switch means to a signal bus signal line in signal bus 0, wherein the number of said switch means connecting logic cell signal lines in bus k to signal bus signal lines in bus (k−1) is less than the number of said switch means connecting signal bus signal lines in bus (k+1) to bus k for k−1 to said predetermined number;

wherein said gate array cell is located in grouping levels of other similar gate array cells in such a way that:

N gate array cells which are arranged horizontally form a grouping of level 0;

N groupings of level 0 which are arranged vertically from a grouping of level 1;

respective N groupings of an odd numbered level (2n−1) which are arranged horizontally form a grouping of an even numbered level (2n); and respective N groupings of an even numbered level (2n) which are arranged vertically form a grouping of an odd numbered level (2n+1).

2. The gate array cell of claim 1 further comprising a plurality of programmable buffer means, each said buffer means being integrated into a corresponding signal line in one of said signal buses, wherein each said buffer means comprises means for introducing a break in said signal line into which it is integrated.

3. The gate array cell of claim 1 wherein said plurality of programmable switch means allows each of said p logic cell signal lines in said gate array cell to be connected to a corresponding signal bus signal line in each of said signal buses.

4. A gate array comprising:

a two-dimensional array of gate array cells, each said gate array cell having:

a logic cell having a logic cell bus including p logic cell signal lines, said logic cell performing operations on signals received on at least one of said logic cell signal lines and generating signals indicative of the results of said operations on at least one of said logic cell signal lines;

a plurality of signal buses, each said signal bus including a plurality of signal bus signal lines, said signal buses being sequentially numbered from 0 to some predetermined number greater than 1; and a plurality of programmable switch means, each said switch means providing means for connecting a signal bus signal line in one of said signal buses to a signal bus signal line in another of said signal buses, said plurality of switch means being arranged such that at least one of said signal bus signal lines in signal bus k may be connected to at least one of said signal bus signal lines in signal bus (k−1) for k=1 to said predetermined number, and each of said p logic cell signal lines in said logic cell bus being connected by a different one of said switch means to a signal bus signal line in signal bus 0, wherein the number of said switch means connecting signal bus signal lines in bus k to signal bus signal lines in bus (k−1) is less than the number of said switch means connecting signal bus signal lines in bus (k+1) to bus k for k=1 to said predetermined number, wherein each logic cell signal line in a gate array cell is connected to a corresponding logic cell signal line in an adjacent gate array cell, provided an adjacent cell is present and provided a break is not present in said logic cell signal line, and wherein said gate array cells are arranged in grouping levels in such a way that:

N gate array cells which are arranged horizontally form a grouping of level 0;

N groupings of level 0 which are arranged vertically form a grouping of level 1;

respective N groupings of an odd numbered level (2n−1) which are arranged horizontally form a grouping of an even numbered level (2n); and respective N groupings of an even numbered level (2n) which are arranged vertically form a grouping of an odd numbered level (2n+1).

\* \* \* \* \*